(12) United States Patent
Stier et al.

(10) Patent No.: US 6,422,482 B1
(45) Date of Patent: Jul. 23, 2002

(54) FUEL INJECTION VALVE

(75) Inventors: Hubert Stier, Asperg; Guenther Hohl, Stuttgart, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/582,518

(22) PCT Filed: Jul. 20, 1999

(86) PCT No.: PCT/DE99/02241

§ 371 (c)(1),
(2), (4) Date: Sep. 21, 2000

(87) PCT Pub. No.: WO00/25019

PCT Pub. Date: May 4, 2000

(30) Foreign Application Priority Data

Oct. 26, 1998 (DE) .......................... 198 49 203

(51) Int. Cl.[7] .................................. B05B 1/08
(52) U.S. Cl. .................. 239/102.2; 239/102.1; 239/397.5; 239/584
(58) Field of Search .................. 239/102.1, 102.2, 239/397.5, 584, 585.1, 585.4, 585.5; 251/129.01, 129.06, 129.14; 310/323, 328, 346, 363, 364, 365, 369

(56) References Cited

U.S. PATENT DOCUMENTS

| 4,284,263 A |   | 8/1981  | Newcomb                        |
| 4,550,744 A | * | 11/1985 | Igashira et al. ..... 251/129.01 X |
| 4,570,098 A |   | 2/1986  | Tomita                         |
| 4,739,929 A | * | 4/1988  | Brandner et al. .... 239/397.5 X |
| 4,814,659 A | * | 3/1989  | Sawada ..................... 310/328 |

FOREIGN PATENT DOCUMENTS

| DE | 195 38 791 | 4/1997  |
| DE | 197 02 066 | 7/1998  |
| EP | 0 869 278  | 10/1998 |

* cited by examiner

Primary Examiner—Steven J. Ganey
(74) Attorney, Agent, or Firm—Kenyon & Kenyon

(57) ABSTRACT

A fuel injection valve for a fuel injection system of an internal combustion engines includes a valve closing body cooperating with a valve seat body to form a sealing seat, and a piezoelectric actuator for actuating the valve closing body. The piezoelectric actuator includes piezo layers and one or more temperature compensation layers. The temperature compensation layers have a temperature expansion coefficient having an operational sign opposite the sign of the temperature expansion coefficient of the piezo layers.

11 Claims, 2 Drawing Sheets

FUEL INJECTION VALVE

FIELD OF THE INVENTION

The present invention concerns fuel injection valves.

BACKGROUND INFORMATION

German published Patent Application No. 195 38 791 concerns a fuel injection valve for fuel injection systems for internal combustion engines in which the valve closing body is actuated by a piezoelectric actuator. The piezoelectric actuator has a plurality of piezo layers made of a piezoelectric material. Electrodes are arranged between the piezo layers so that an electrical voltage can be applied to the piezo layers, causing the piezoelectric actuator, used for actuating the valve closing body, to expand.

A problem with using piezoelectric actuators is believed to be thermal expansion. Piezoelectric materials, unlike materials such as steel or plastic, have a negative temperature expansion coefficient. Therefore, the piezoelectric actuator contracts with increasing temperature, while the surrounding housing expands. The different temperature expansion coefficients of the piezoelectric actuator and the housing result in a temperature-dependent valve lift if not compensated using appropriate measures.

For temperature compensation, German Published Patent Application No. 195 38 791 apparently proposes that the valve housing be designed as two parts made of two different materials. For example, it is proposed that one housing part be made of steel and the other housing part be made of Invar. By an appropriate selection of the length of the first housing part made of steel and of the second housing part made of Invar, the overall thermal expansion of the housing should be matched to the thermal expansion of the piezoelectric actuator and thus the piezoelectric actuator and the housing surrounding the piezoelectric actuator expand and contract in the same manner.

It is believed that a disadvantage of this measure is the cost of manufacturing the valve housing and the relatively high cost of the material of the second housing part, which is preferably made of Invar. Furthermore, it must be taken into consideration that the valve housing and the actuator may be of different temperatures. Thus the piezoelectric actuator may heat up due to its heat losses, in particular, when the fuel injection valve is frequently actuated, and its temperature is only slowly transferred to the valve housing. On the other hand, the temperature of the valve housing is influenced by the heat transferred from the internal combustion engine on which the fuel injection valve is mounted. This type of temperature compensation is therefore not believed to be satisfactory.

German Patent No. 195 19 192 purportedly concerns a hydraulic lift transformer arranged between the piezoelectric actuator and the valve needle that actuates the valve closing body. Temperature compensation results from the fact that the lift transformer only responds to the relatively quick movement resulting in the intended opening of the fuel injection valve, whereas a relativity slow, temperature-dependent expansion or contraction of the piezoelectric actuator may cause the hydraulic fluid to leak out via guide gaps. It is believed that a disadvantage of this design is, however, the relatively high cost of the hydraulic lift transformer.

Other temperature compensation methods include forced tempering of the piezoelectric actuator using a liquid or gaseous medium, which is held at a constant temperature in a closed circuit, or a series arrangement of piezoelectric actuators with a temperature-compensating piece, which is arranged between the piezoelectric actuator and a valve needle actuating the valve closing body, for example. While the first method may be relatively costly, the use of a compensating piece arranged in series is believed to have the disadvantage that the piezoelectric actuator and the compensating piece, as mentioned before, are not necessarily subjected to the same temperature or the same temperature variation; therefore, temperature compensation is relatively inaccurate.

SUMMARY OF THE INVENTION

The fuel injection valve according to an exemplary embodiment of the present invention is believed to have the advantage that the piezoelectric actuator of the fuel injection valve has considerably improved temperature compensation. According to an exemplary embodiment of the present invention, one or more temperature compensation layers having a temperature expansion coefficient with opposite signs with respect to the temperature expansion coefficient of the piezo layers are provided directly in the piezoelectric actuator. Through an appropriate selection of the number and thickness of the temperature compensation layers, accurate temperature compensation can be achieved.

By embedding the temperature compensation layers in the piezo layers of the piezoelectric actuator, it is at least better ensured that the temperature compensation layers are subjected to the same temperature and the same temperature variation as the piezo layers of the actuator. In particular, a large contact surface exists between the piezo layers and temperature compensation layers, so that the temperature of the temperature compensation layers and that of the piezo layers are quickly equalized. This is important because the heat loss of the piezoelectric actuator can be subjected to considerable fluctuation when the actuation frequency of the fuel injection valve varies as a result of a variation in the internal combustion engine speed. Due to the large contact surface between the temperature compensating layers and the piezo layers and the proximity of the temperature compensating layers to the piezo layers, temperature compensation by the temperature compensation layers can quickly follow these fluctuations. In addition, a change in the temperature of the actuator due to fluctuating amounts of heat transferred from the internal combustion engine can be quickly compensated by using the method according to the present invention. Expensive forced tempering of the piezoelectric actuator is not necessary.

In a particularly advantageous manner, the temperature compensation layers can be used simultaneously as electrodes for activating the piezo layers if the temperature compensation layers are made of a metallic material.

Thus, the piezoelectric actuator is temperature compensated to a high degree. However, the valve housing surrounding the actuator, which is usually made of metal or plastic, can still be subjected to thermal expansion resulting in a temperature-dependent position shift of the valve seat body with respect to the valve closing body connected to the actuator. In order to avoid this, an equalizing sleeve made of a ceramic material is advantageously provided, which either surrounds the piezoelectric actuator or is itself surrounded by the piezoelectric actuator. The piezoelectric actuator is either in contact with the valve housing via the equalizing sleeve or actuates the valve closing body via the equalizing sleeve and, optionally, a valve needle. If the equalizing sleeve has the same axial length as the piezoelectric actuator, the temperature of the valve housing has no effect on the axial position of the valve closing body with respect to the axial position of the valve seat body, i.e., temperature compensation of the valve housing is achieved.

According to an exemplary embodiment, a first end of the piezoelectric actuator is connected to the valve closing body via a valve needle and a first end of the equalizing sleeve is in contact with the valve housing. A connecting element, which may be plate-shaped for example, is held in contact with the second end of the equalizing sleeve and the second end of the piezoelectric actuator by a spring. According to another exemplary embodiment design, the first end of the piezoelectric actuator is in contact with the valve housing, and the first end of the equalizing sleeve is connected to the valve closing body via a valve needle. A plate-shaped connecting element is held in contact with the second end of the equalizing sleeve and the second end of the piezoelectric actuator by a spring also in this case.

DETAILED DESCRIPTION

Figure 1:
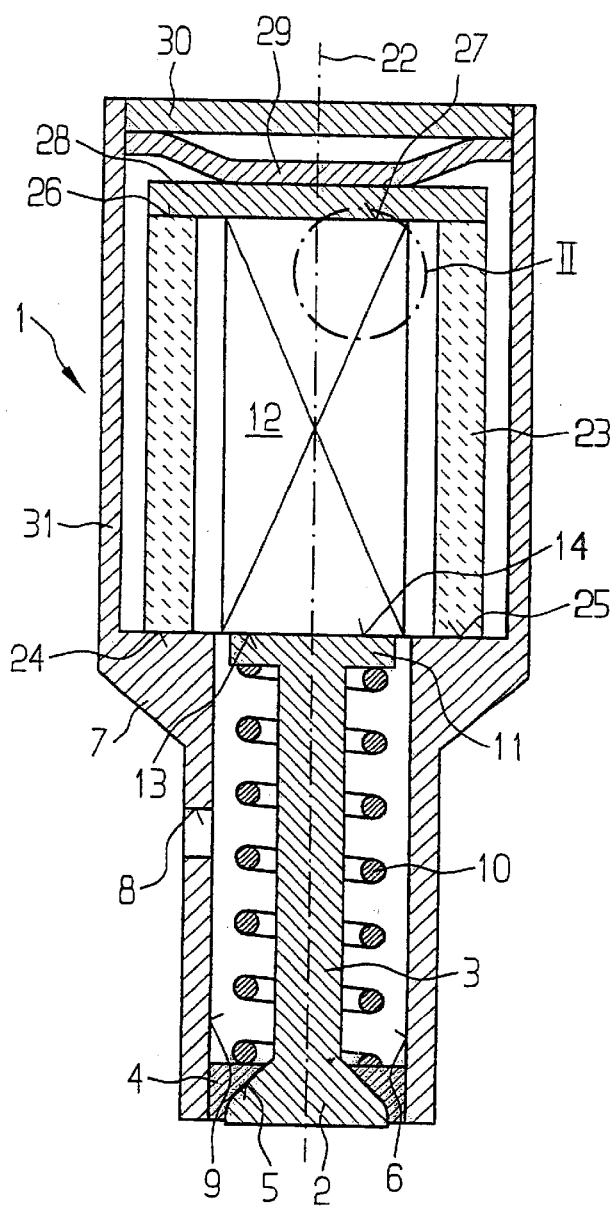
FIG. 1 shows a section through a fuel injection valve according to an exemplary embodiment of the present invention.

A section of an injection valve according to an exemplary embodiment of the present invention is shown in FIG. 1. Fuel injection valve 1 is used to inject fuel in particular into an externally ignited compressed-mixture internal combustion engine.

Fuel injection valve 1 has a valve closing body 2 designed in one piece with valve needle 3 and forms a sealing seat together with a valve seat body 4. The embodiment of fuel injection valve 1 shown in FIG. 1 is a fuel injection valve 1 opening outward. A valve seat surface 5 is therefore arranged on the outside of valve seat body 4.

Valve seat body 4 is inserted in an axial longitudinal bore 6 of a valve housing 7 and sealingly connected to valve housing 7 through welding, for example. Fuel enters via a fuel inlet opening 8 in valve housing 7 and goes to the sealing seat formed by valve closing body 2 and valve seat body 4 via a spring support space 9. A restoring spring 10 arranged between valve seat body 4 and a flange 11 of valve needle 3 is arranged in spring support space 9 formed by axial longitudinal bore 6 of valve housing 7. Restoring spring 10 transmits a restoring force to valve needle 3 in the closing direction of fuel injection valve 1.

Valve needle 3 and valve closing body 2 are actuated via a piezoelectric actuator 12 whose first end 13 is in flush contact with end face 14 of flange 11 of valve needle 3. When piezoelectric actuator 12 is electrically excited, it expands in its axial longitudinal direction and displaces valve needle 3 and valve closing body 2 designed in one piece with valve needle 3 downward in FIG. 1, so that fuel injection valve 1 opens. After the electrical excitation voltage is turned off, piezoelectric actuator 12 contracts again, so that valve closing body 2 is moved back into its closing position by restoring spring 10.

A feature according to an exemplary embodiment of the present invention is the layered design of piezoelectric actuator 12. An exemplary embodiment of the layered structure of piezoelectric actuator 12 is shown enlarged in FIG. 2.

Piezoelectric actuator 12 has a plurality of stacked piezo layers 21 made of a piezoelectric material. Electrodes are applied on piezo layers 21 such as, for example, by sputtering or vapor deposition, so that an electric voltage can be applied to piezo layers 21 resulting in an electrical field being formed in piezo layers 21 in the direction of longitudinal axis 22 of fuel injection valve 1, causing piezoelectric actuator 12 to expand.

The expansion and contraction of piezo layers 21 depend not only on the electrical field intensity applied, but also, to a considerable degree, on the temperature. Unlike usual materials, piezoelectric substances have a negative thermal expansion coefficient ($\alpha<0$), which means that piezoelectric materials contract with increasing temperature. In order to prevent an unintended valve motion caused by temperature fluctuations, this temperature-dependent expansion of piezo layers 21 must be compensated. Therefore, according to an exemplary embodiment of the present invention, at least one, or a plurality of temperature compensation layers 20 are arranged between piezo layers 21. Temperature compensation layers 20 have a temperature expansion coefficient whose operational sign is opposite to that of the temperature expansion coefficient of piezo layers 21, which means that temperature compensation layers 20 are made of a material with a positive temperature expansion coefficient ($\alpha>0$), while piezo layers 21, have a negative temperature expansion coefficient ($\alpha<0$). By selecting the appropriate number and thickness of temperature compensation layers 20, the sum of contractions or expansions of all temperature compensation layers 20 corresponds in absolute value to the sum of expansions or contractions of all piezo layers 21, but with the opposite sign. Effective temperature compensation is achieved in this manner.

Figure 2:
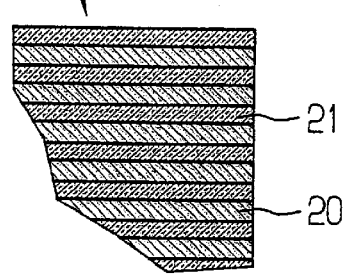
FIG. 2 shows detail II in FIG. 1 in a detailed sectional view.
Figure 3:
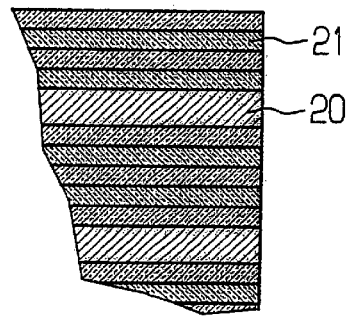
FIG. 3 shows detail II in FIG. 1 in a detailed sectional view according to a variant of the exemplary embodiment of FIG. 2.

In the exemplary embodiment illustrated in FIG. 2, a piezo layer 21 and a temperature compensation layer 20 are alternatingly sandwiched in a piezoelectric actuator 12. FIG. 3 shows, as an enlargement of detail II in FIG. 1, a piezoelectric actuator 12 having an alternatively layered structure, in which a temperature compensation layer 20 is arranged between a plurality of piezo layers 21.

A material having a high positive temperature expansion coefficient such as aluminum, copper, or a suitable plastic is well-suited for temperature compensation layers 20; materials having a good thermal conductivity and a low heat capacity, so that the temperature of temperature compensation layer 20 is quickly equalized to the temperature of piezo layers 21, are also advantageous.

If temperature compensation layers 20 are made of a metallic material, temperature compensation layers 20 may advantageously also be used as electrodes for piezo layers 21.

Since temperature compensation layers 20 are arranged in close proximity to piezo layers 21, rapid equalization of the temperature of temperature compensation layers 20 to the temperature of piezo layers 21 is ensured, so that temperature compensation is not subject to any considerable delay.

Through the measures described according to the exemplary embodiment of the present invention, effective temperature compensation of piezoelectric actuators 12 is achieved, so that the resulting temperature expansion coefficient of piezoelectric actuator 12 is at least approximately equal to zero. However, if piezoelectric actuator 12 is in direct contact with a solid component of valve housing 7, unintended relative displacement of valve seat body 4 with respect to valve closing body 2 may occur, which may result in unintended valve opening due to the temperature expansion or contraction of the areas of valve housing 7 surrounding actuator 12. Therefore it is proposed according to the present invention that the thermal expansion of valve housing 7 be also compensated. For this purpose, an equalizing sleeve 23 surrounding piezoelectric actuator 12 is provided. One end 24 of equalizing sleeve 23 is in contact with first step 25 of valve housing 7. First end 13 of piezoelectric actuator 12 acts via valve needle 3, as described above, upon valve closing body 2. Second end 26 of equalizing sleeve 23, opposite first end 24, and second end 27 of piezoelectric actuator 12, opposite first end 13 are connected via a connecting element 28 which has a plate-shaped design in the exemplary embodiment. Connecting element 28 is movable in the axial direction in valve housing 7 and is held in contact both with second end 26 of equalizing sleeve 23 and second end 27 of piezoelectric actuator 12 by spring 29 designed in the present embodiment as a flat spring. Valve housing 7 is terminated by an end plate 30, which is in contact with spring 29 and which may be connected to main body 31 of valve housing 7, for example, by welding.

Equalizing sleeve 23 has the same axial length as piezoelectric actuator 12 and is made of a material having an extremely low temperature expansion coefficient, preferably a ceramic material or a glass material. Since piezoelectric actuator 12, as described above, is temperature compensated, both equalizing sleeve 23 and piezoelectric actuator 12 are subject to virtually no temperature-dependent longitudinal expansion. Connecting element 28 is therefore always in the same axial position regardless of the operating temperature of fuel injection valve 1 with respect to step 25 of valve housing 7, and regardless of a possible temperature-dependent longitudinal expansion to which the areas of valve housing 7 surrounding equalizing sleeve 23 and piezoelectric actuator 12 are subjected. Therefore, temperature-dependent expansion of these areas of valve housing 7 causes no axial displacement of valve seat body 7 with respect to valve closing body 2. If valve needle 3 and a section of valve housing 7 between step 25 and valve seat body 4 are made of the same material, a change in temperature in this area also causes no relative change in the position of valve closing body 2 with respect to valve seat body 4, so that fuel injection valve 1 as a whole is effectively temperature compensated.

Figure 4:
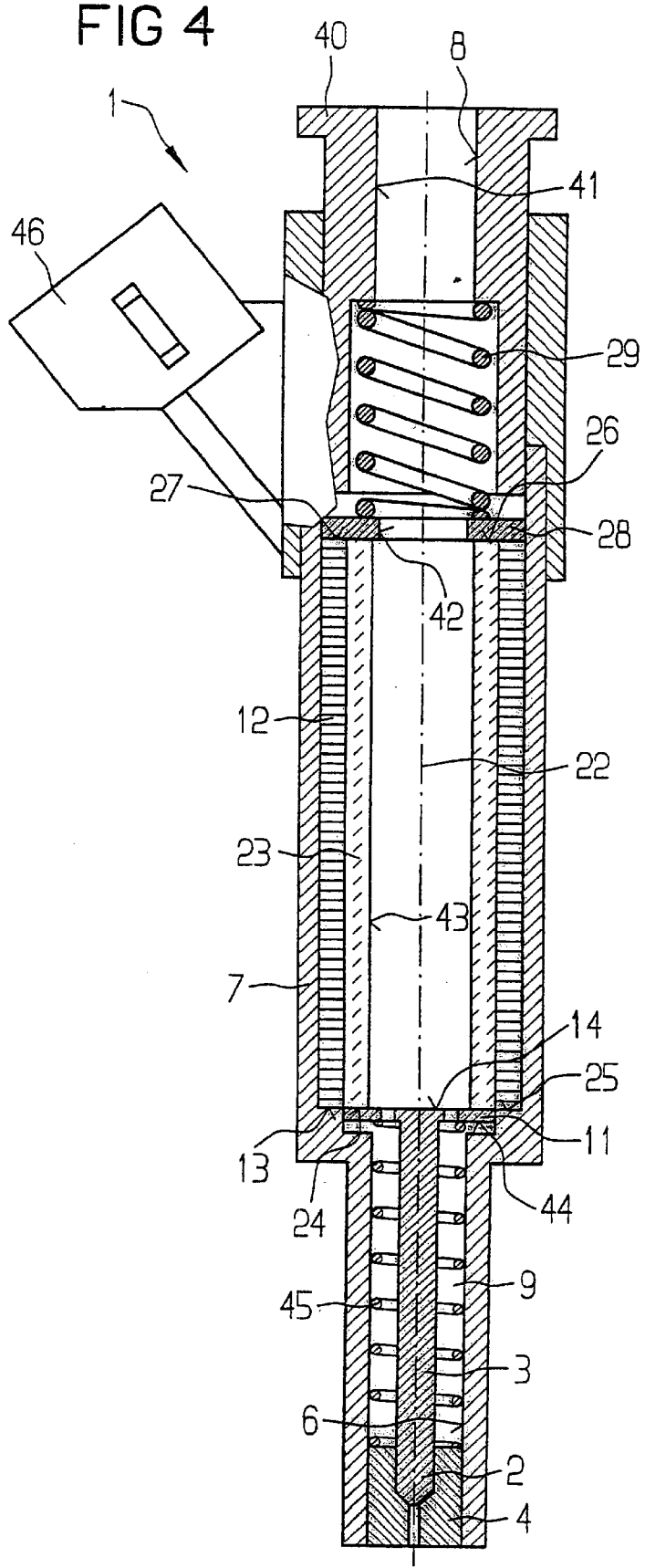
FIG. 4 shows a section through a fuel injection valve according to another exemplary embodiment of the present invention.

FIG. 4 shows another embodiment of fuel injection valve 1 according another exemplary embodiment of the present invention. In the exemplary embodiment shown in FIG. 4, temperature compensation is implemented in a fuel injection valve 1 opening inward. In order to facilitate identification, elements described previously are provided with the same reference symbols, so that a redundant description is unnecessary.

In the exemplary embodiment illustrated in FIG. 4, piezoelectric actuator 12 has a sleeve shape. It has, however, the same layered structure as shown in FIGS. 2 and 3, i.e., temperature compensation layers 20 are arranged between piezo layers 21, so that piezoelectric actuator 12 is temperature compensated. The effective temperature expansion coefficient of actuator 12 is therefore essentially equal to zero. In the exemplary embodiment illustrated in FIG. 4, an equalizer sleeve 23 made of a ceramic material and surrounded by piezoelectric actuator 12 may be provided. Fuel inlet opening 8 is formed at a fuel inlet nozzle 40 at the end of fuel injection valve 1 opposite valve seat body 4. Fuel is supplied to the sealing seat via an axial bore 41 in fuel inlet nozzle 40, a cutout 42 in plate-shaped connecting element 28, an axial longitudinal cutout 43 in equalizing sleeve 23, through bores 44 in flange 11 of valve needle 3, and spring support space 9. The pulling spring 45 is provided in spring support space 9.

Furthermore, a connector plug 46 used for electrical contacting of piezoelectric actuator 12 is illustrated in FIG. 4. Connector plug 46 may be designed as an injection molded plastic part, for example.

When piezoelectric actuator 12 is electrically actuated, its first end 13 is in contact with step 25 of valve housing 7 and displaces plate-shaped connecting element 28 in FIG. 4 upward against spring 29. Flange 11 of valve needle 3 is held in contact with first end 24 of equalizing sleeve 23 by pulling spring 45. At the same time, second end 26 of equalizing sleeve 23 is permanently held in contact with plate-shaped connecting element 28. Therefore, the expansion of piezoelectric actuator 12 causes valve closing body 2 to lift and fuel injection valve 1 to thereby open. It is essential that the elastic force of spring 29 be greater than the elastic force of pulling spring 45. When the electrical excitation voltage is turned off, piezoelectric actuator 12 contracts again so that spring 29 again brings valve closing body 2 in contact with valve seat body 4 via plate-shaped connecting element 28, equalizing sleeve 23, and valve needle 3 and thus closes fuel injection valve 1.

Since equalizing sleeve 23 has the same axial length as piezoelectric actuator 12 and both piezoelectric actuator 12 and equalizing sleeve 23 have an extremely low temperature expansion coefficient, valve lift is almost temperature-independent. In particular, the area of valve housing 7 surrounding piezoelectric actuator 12 and equalizing sleeve 23 have no influence on the valve lift, since its thermal expansion is compensated by spring 29.

A conducting compound can be applied between actuator 12 and equalizing sleeve 23 either in the exemplary embodiment of FIG. 1 or in the exemplary embodiment of FIG. 4 for improved heat capacity between equalizing sleeve 23 and actuator 12.

Instead of pulling spring 45, the flush contact between flange 11 of valve needle 3 with first end 24 of equalizing sleeve 23 and the flush contact with second end 26 of equalizing sleeve 23 with plate-shaped connecting element 28 can also be implemented by gluing or pressing, for example.

Since fuel flows through the center of fuel injection valve 1 according to the exemplary embodiment illustrated in FIG. 4, rotation-symmetric components can be used, which allows inexpensive manufacturing. Fuel injection valve 1, with fuel flowing through its center, requires no lateral fuel inlet opening 8. Therefore installation on an internal combustion engine using normal hydraulic connecting methods is simplified. Due to the fact that no parts subject to wear are used, a long-lasting fuel injection valve 1 results according to the exemplary embodiments of the present invention.

What is claimed is:

1. A fuel injection valve for a fuel injection system of an internal combustion engine, the fuel injection valve comprising:
   a valve seat body;
   a valve closing body cooperating with the valve seat body to form a sealing seat;
   a piezoelectric actuator for actuating the valve closing body, wherein the piezoelectric actuator includes a plurality of piezo layers made of a piezoelectric material having a negative temperature expansion coefficient, and at least one temperature compensation layer having a positive temperature expansion coefficient, the piezoelectric actuator having a first end facing the valve seat body and a second end distal to the valve seat body;

a valve housing; and an equalizing sleeve made of a material having a low temperature expansion coefficient, wherein the equalizing sleeve determines an axial position of the piezoelectric actuator in the valve housing, and wherein the equalizing sleeve has a first end having an axial position equivalent to the first end of the piezoelectric actuator, and a second end having an axial position equivalent to the second end of the piezoelectric actuator.

2. The fuel injection valve of claim 1, wherein a thickness of the at least one temperature compensation layer provides that the piezoelectric actuator exhibits at least one of a reduced length change and an essentially zero length change as a function of a temperature change.

3. The fuel injection valve of claim 1, wherein the plurality of the piezo layers and the at least one temperature compensation layer are alternatingly sandwiched in the piezoelectric actuator.

4. The fuel injection valve of claim 1, wherein the at least one temperature compensation layer is arranged between the plurality of the piezo layers in the piezoelectric actuator.

5. The fuel injection valve of claim 1, wherein the at least one temperature compensation layer is made of one of copper, aluminum and a suitable plastic.

6. The fuel injection valve of claim 1, wherein the at least one temperature compensation layer is made of a metallic material and is used at a same time as electrodes for the plurality of the piezo layers.

7. The fuel injection valve of claim 1, further comprising:

a valve needle; and a connecting element;

wherein:
the first end of the piezoelectric actuator is connected to the valve closing body via the valve needle;
the first end of the equalizing sleeve contacts the valve housing; and
the connecting element contacts the second end of the piezoelectric actuator and the second end of the equalizing sleeve.

8. The fuel injection valve of claim 1, wherein the equalizing sleeve is made of a ceramic material.

9. A fuel injection valve for a fuel injection system of an internal combustion engine, the fuel injection valve comprising:

a valve seat body;

a valve closing body cooperating with the valve seat body to form a sealing seat;

a piezoelectric actuator for actuating the valve closing body, wherein the piezoelectric actuator includes a plurality of piezo layers made of a piezoelectric material having a negative temperature expansion coefficient, and at least one temperature compensation layer having a positive temperature expansion coefficient, the piezoelectric actuator having a first end facing the valve seat body and a second end distal to the valve seat body;

a valve housing; and an equalizing sleeve made of a material having a low temperature expansion coefficient, wherein the equalizing sleeve determines an axial position of the piezoelectric actuator in the valve housing, and wherein the equalizing sleeve has a first end having an axial position equivalent to the first end of the piezoelectric actuator, and a second end having an axial position equivalent to the second end of the piezoelectric actuator, wherein the equalizing sleeve connects the piezoelectric actuator to the valve closing body, the piezoelectric actuator being formed as a sleeve that surrounds the equalizing sleeve.

10. The fuel injection valve of claim 9, further comprising:

a valve needle;

a spring; and a connecting element;

wherein:
the first end of the piezoelectric actuator contacts the valve housing;
the first end of the equalizing sleeve connects to the valve closing body via the valve needle; and
the connecting element is held by the spring in contact with the second end of the piezoelectric actuator and the second end of the equalizing sleeve.

11. The fuel injection valve of claim 9, wherein the equalizing sleeve is arranged so that fuel injected by the fuel injection valve flows through the equalizing sleeve.

* * * * *